US006087193A

United States Patent [19]

Gray

[11] Patent Number: 6,087,193

[45] Date of Patent: Jul. 11, 2000

[54] METHOD OF PRODUCTION OF FET REGULATABLE FIELD EMITTER DEVICE

[75] Inventor: Henry F. Gray, Alexandria, Va.

[73] Assignee: The United States of America as represented by the Secretary of the Navy, Washington, D.C.

[21] Appl. No.: 08/241,976

[22] Filed: May 12, 1994

Related U.S. Application Data

[62] Division of application No. 07/921,658, Jul. 30, 1992, Pat. No. 5,359,256.

[51] Int. Cl.[7] ..................... H01L 21/00

[52] U.S. Cl. ..................... 438/20

[58] Field of Search ..................... 437/54, 59; 438/20

[56] References Cited

U.S. PATENT DOCUMENTS

| | | |
|---|---|---|
| 3,665,241 | 5/1972 | Spindt et al. . |
| 4,307,507 | 12/1981 | Gray et al. . |
| 4,570,106 | 2/1986 | Sohval et al. . |
| 4,578,614 | 3/1986 | Gray et al. . |
| 4,663,559 | 5/1987 | Christensen . |
| 5,016,481 | 5/1991 | Jacobsen et al. . |
| 5,103,145 | 4/1992 | Doran . |
| 5,191,217 | 3/1993 | Kane et al. . |
| 5,268,648 | 12/1993 | Calcatera . |
| 5,319,233 | 6/1994 | Kane . |

OTHER PUBLICATIONS

A. Ting. et. al., Technical Digest of IVMC, 91 Aug. 22–24, 1991 pp. 200–201.

H.F. Gray et. al., IE DM 91–201, 1991 pp 201–4.

*Primary Examiner*—Charles Bowers
*Assistant Examiner*—Martin Sulsky
*Attorney, Agent, or Firm*—Charles J. Stockstill

[57] ABSTRACT

A non-power generating current limiting device such as a field effect transistor is provided to output a regulated current in dependence upon a control voltage. An electron field emitter is connected to a drain or output of the non-power generating current limiting device to receive the regulated current. A tip of the electron field emitter emits electrons towards a collector anode. An extractor gate can be provided between the electron field emitter and the collector anode to control the rate of electron emission from the electron field emitter. Because the non-power generating current limiting device regulates the current to the electron field emitter, a maximum current output of the electron field emitter is limited to the regulated current from the voltage controlled current source. The electron field emitter is thus protected from destruction due to excess current. The non-power generating current limiting device can also be used to modulate electron emission from the field emitter.

5 Claims, 9 Drawing Sheets

FIG. 18
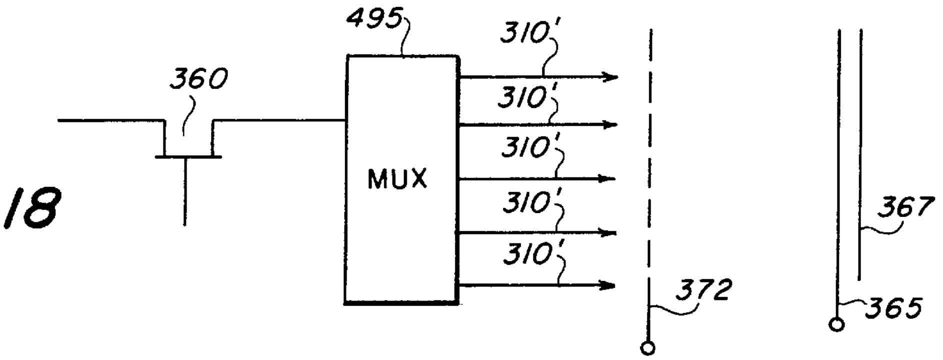
FIG. 19
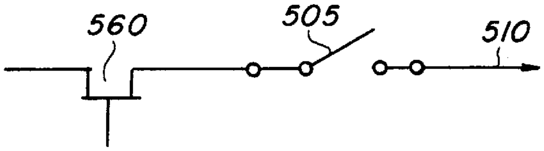
FIG. 20
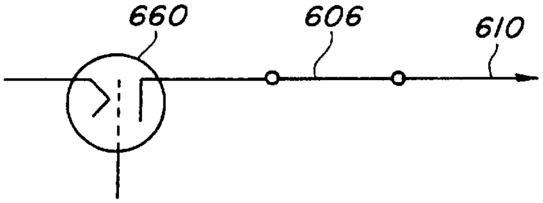
FIG. 21
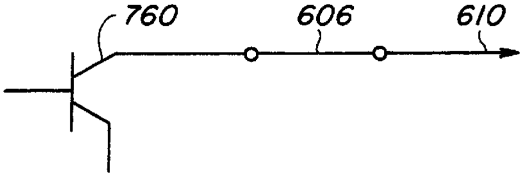
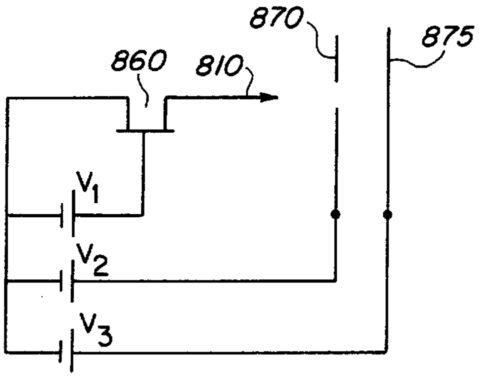
FIG. 22
FIG. 23
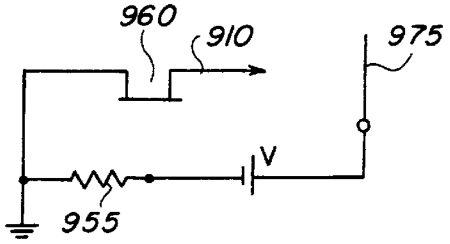

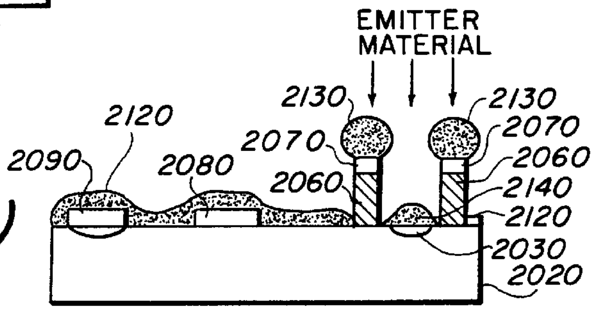
FIG. 28(bii)

METHOD OF PRODUCTION OF FET REGULATABLE FIELD EMITTER DEVICE

This is a division of application Ser. No. 07/921,658 filed on Jul. 30, 1992 now U.S. Pat. No. 5,359,256.

BACKGROUND OF THE INVENTION

1. Field of the Invention

This invention relates to a regulatable field emitter device and, more particularly, relates to a field emitter device having control of the electron emission therefrom.

2. Description of the Related Art

Electron emission from field emitters has been difficult to control. If too much current is emitted from a field emitter, the field emitter may destroy itself due to excessive heat generation by current induced joule heating. Furthermore, heavily doped semiconductor field emitters or those having an elongated shape which permits avalanche breakdown are susceptible to destruction from too much electron emission due to heating, e.g. the conduction band of the semiconductor is populated with thermally generated carriers.

In the art of field emitters, the term "field emitter array (FEA)" structure is customarily used to generically refer to one or more field emitters, each of which has its own integral extractor gate and associated extraction aperture. Typically, a large number of field emitters are used in the art for tasks such as controlling the luminance on portions of a luminescent screen. Field emitters include metallic field emitters, thin-film field emitter cathodes and semiconductor cones. Known methods to limit the current output of a field emitter have been proposed. A sufficiently high resistance in series with the field emitter is known to restrict current emission from the field emitter. Greene and Gray in U.S. Pat. No. 4,513,308 proposed controlling field emission from a semiconductor device by back-biasing a PN junction. Furthermore, Gray et al. in "A Vacuum Field Effect Transistor Using Silicon Field Emitter Arrays" in the *IEDM Technical Digest,* Dec. 7–10, 1986, pp. 776–779 and in the proceedings of the *Materials Research Society,* Volume 76, 1987, p. 25, proposed control by velocity saturation inside the semiconductor field emitter of a vacuum field effect transistor. The vacuum field effect transistor proposed by Gray et al. in these publications uses electron emission from a field emitter, rather than a depletion region under a gate of a solid state field effect transistor, to control the switching of the vacuum field effect transistor. In this vacuum field effect transistor, the velocity saturation inside the field emitter acted to restrict current flow.

SUMMARY OF THE INVENTION

It is therefore an object of the present invention to provide a field emitter device having a current regulating capability.

It is another object of the present invention to provide a field emitter device capable of limiting the field emission current output to a predetermined value.

It is still another object of the present invention to provide a field emitter device capable of controlling and/or modulating the field emission current output while still maintaining a limit to the maximum current.

Another object of the present invention is to provide a compact, low cost emission controlled field emitter device.

In order to achieve the foregoing in other objects, in accordance with the purposes of the present invention as described herein, a voltage controlled current source, such as a field effect transistor, is provided to output a regulated current in dependence upon a control voltage. An electron field emitter is connected to a drain or output connection of the voltage controlled current source to receive the regulated current. An electron field emitter emits electrons towards a collector anode. The collector anode has sufficiently high voltage to collect field emission from the field emitter. An extractor gate or extraction electrode can be provided between the electron field emitter and the collector anode to cause electron emission from the electron field emitter. Because the voltage controlled current source regulates the current to the electron field emitter, a maximum current output of the electron field emitter is limited to the regulated current from the voltage controlled current source. Therefore, the electron field emitter is protected from destruction resulting from excess emission current in a way not heretofore possible.

The above-mentioned and other objects of the present invention will become more apparent from the following description when read in conjunction with the accompanying drawings. However, the drawings and descriptions are merely illustrative in nature and are not restrictive.

BRIEF DESCRIPTION OF THE DRAWINGS

FIG. 18 illustrates a schematic block diagram of the field emitter device of the present invention having a multiplexer;

FIGS. 19–21 illustrates schematic block diagrams of additional embodiments of the present invention;

FIG. 22 illustrates a schematic block diagram of the field emitter device of the present invention connected in a circuit;

FIG. 23 illustrates a schematic block diagram of the field emitter device of the present invention connected in a feedback arrangement;

DESCRIPTION OF THE PREFERRED EMBODIMENTS

Figure 1:
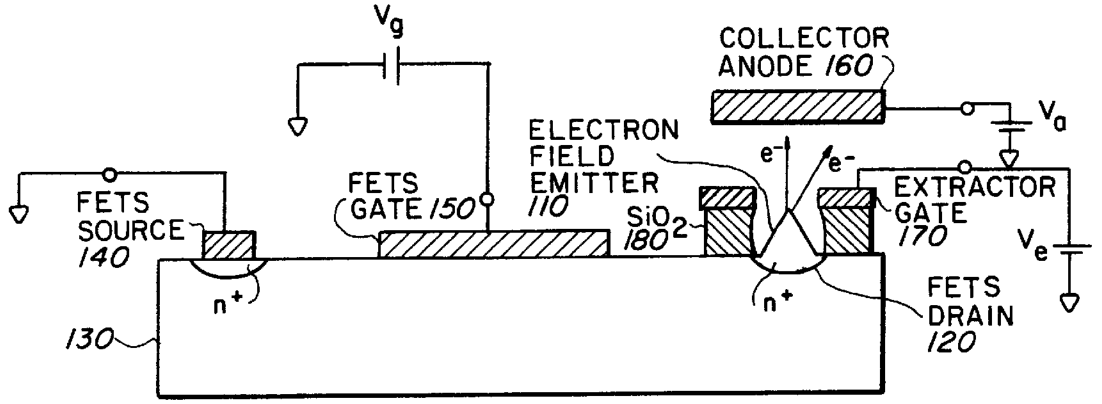
FIG. 1 illustrates a diagram of an end view of a monolithically formed electron field emitter device of the present invention.

FIG. 1 illustrates an electron field emitter device having a cone-shaped electron field emitter 110 fabricated directly on the drain 120 of a field effect transistor structure (FETS). The field effect transistor structure is fabricated from a substrate 130 and has a connection to a FETS source 140 and a connection to a FETS gate 150 as illustrated in FIG. 1. The electron field emitter 110 is provided with a source of current from the drain 120 of the field effect transistor structure. The source of current is regulated by the connections to the FETS source 140 and the FETS gate 150. A voltage on the collector anode 160 collects electrons from the electron field emitter 110. However, because the drain 120 of the field effect transistor structure provides a limited current, the electron field emitter 110 is not destroyed when the collector anode 160, or extractor gate 170, has an extremely large voltage (e.g $V_a$ or $V_e$ respectively) which would cause emission of too many electrons from the tip of the electron field emitter 110 if the FETS was absent. An extractor gate 170 can be placed between the electron field emitter 110 and the collector anode 160 by providing, for example, a ring-shaped layer of metal upon a layer of silicon dioxide ($SiO_2$) 180 formed around the drain 120 of the field effect transistor. A voltage Vg applied to the extractor gate 170 can be used to control or gate the number of electrons emitted from the electron field emitter 110 towards the collector anode 160.

The type of field emitter can take any structure or shape, such as the cone or conical shape illustrated in FIG. 1 or a pyramidal or wedge shape. Furthermore, the field emitter can be the edge of a thin film. Furthermore, the field emitter can take on any orientation such as vertical or horizontal and be gated with or without an extractor gate.

Figure 2:
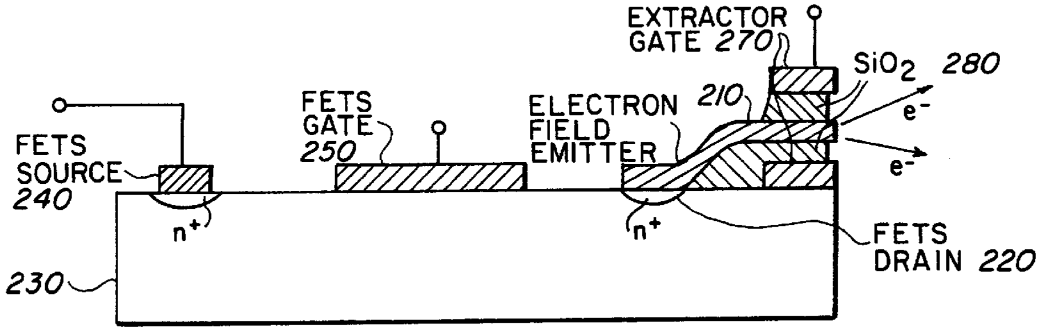
FIG. 2 illustrates a diagram of an end view of the present invention in an embodiment having a thin-film edge electron field emitter.

FIG. 2 illustrates a thin-film field emitter integrally fabricated with a connection from an electron field emitter 210 to a FETS drain 220. An extractor gate 270 is provided as layers above and below the electron field emitter 210 separated therefrom by two layers of an insulator such as silicon dioxide ($SiO_2$) 280. The current provided to the electron field emitter 210 is limited by the drain 220 of the field effect transistor structure. The field effect transistor structure is built on the substrate 230 and controlled by FETS source 240 and FETS gate 250.

The field emitter device of the present invention combines two previously known devices to obtain benefits not heretofore possible. For example, consider the combination of a field effect transistor structure and a previously known field emitter device having a field emitter, an extractor gate and a collector anode. Both this field effect transistor structure and this field emitter device are three terminal devices. This field effect transistor structure has a terminal at the source, at the gate and at the drain, and this field emitter device has a terminal at the electron field emitter, at the collector anode and at the extractor gate.

Figure 5:
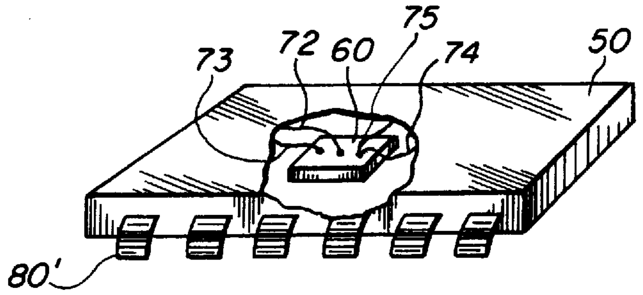
FIG. 5 illustrates a view of the field emitter device of the present invention packaged in a dual inline package chip.

When the field emitter device is combined with the field effect transistor structure, the drain of the field effect transistor structure is connected directly to the electron field emitter of the field emitter device. A new four terminal device is thus created from two three terminal devices. This new device can be packaged, for example, as a dual inline package chip as illustrated in FIG. 5.

A four terminal device is illustrated, for example, by the device of FIG. 1. The device of FIG. 1 contains the connection between the electron field emitter 110 and the drain 120 as an internal connection integrally formed therein. In the device illustrated in FIG. 1, no connections to a "floating" electrical node between the electron field emitter 110 and drain 120 are provided. A new device is thus obtained taking advantage of the characteristics from both a field effect transistor structure and an electron field emitter.

Figure 3:
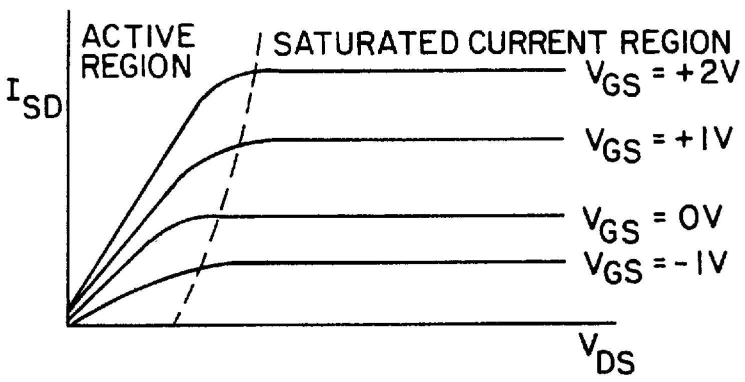
PRIOR ART FIG. 3
FIG. 3 illustrates a plot of the current-voltage characteristics of a conventional field effect transistor.
Figure 4:
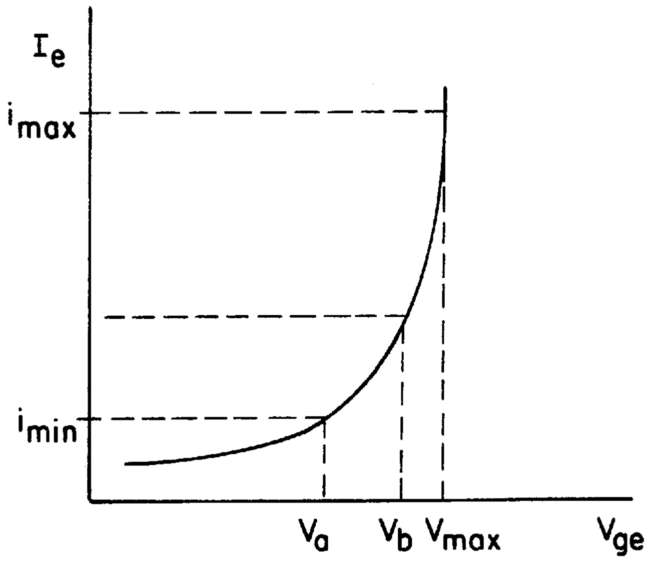
PRIOR ART FIG. 4
FIG. 4 illustrates the current-voltage characteristics of a conventional field emitter.

FIG. 3 illustrates the current-voltage characteristics of a conventional field effect transistor structure and FIG. 4 illustrates the current-voltage characteristics of a conventional field emitter. FIG. 3 illustrates a plot of the source-to-drain current $I_{SD}$ with respect to the drain-to-source voltage $V_{DS}$ for various gate-to-source voltages $V_{GS}$ of a field effect transistor structure. In FIG. 3 a saturated current region is evident having a flat or constant source-to-drain current $I_{SD}$ for a given gate-to-source voltage $V_{GS}$. When the drain-to-source voltage is sufficient to cause operation in the saturated region, the source-to-drain current $I_{SD}$ is constant.

FIG. 4 illustrates a plot of the current-voltage characteristic of a conventional field emitter. An emitter current $I_e$ is plotted with respect to an extractor gate-emitter tip voltage $V_{ge}$ as described by the Fowler-Nordheim equation. The emitter current $I_e$ is the amount of current (number of electrons) emitted from the field emitter, all of which have been found to emanate from the tip of the field emitter. The extractor gate-emitter tip voltage $V_{ge}$ is the potential difference between the tip of the field emitter and one or both of a collector anode and an extractor gate. As can be seen from the plot in FIG. 4, the field emitter is destroyed by excessive current and heat when the emitter current $I_e$ is at a maximum current Imax at maximum voltage $V_{max}$.

The present invention combines the characteristics of the field effect transistor illustrated in FIG. 3 with the characteristics of the field emitter illustrated in FIG. 4 to limit the emission current output of the field emitter to a particular curve illustrated in FIG. 3. Thus, the emission current output of the field emitter $I_e$ cannot destroy the field emitter at an extractor gate voltage at or above the voltage $V_{max}$ (relative to the FET source voltage). This is because the curve illustrated in FIG. 3 provides for a maximum allowable output current from the FETS. When operated in the saturated current region, the maximum allowable current output from the FETS is constant. Furthermore, should the charge on a collector anode or extractor gate become very positive, the current $I_{SD}$ output of the drain of the field effect transistor structure will not exceed the constant current illustrated in the saturated current region of FIG. 3. Thus, the field effect transistor insures that the emission current output of the field emitter is limited.

Besides protecting the field emitter from destruction by excessive current, the field effect transistor structure also provides control of the emission current emitted from the field emitter. Various currents output of the electron field emitter can be controlled by adjusting the gate-to-source voltage $V_{GS}$. Accordingly, variable operation in either of the saturated current region or the active region is possible by adjusting the gate-to-source voltage $V_{GS}$ of the FETS.

The drain-to-source voltage $V_{DS}$ of the FETS cannot be varied because the electrical node between the drain of the field effect transistor structure and the field emitter is an "isolated" node. That is, the electrical node consists of a connection from only the drain to the emitter. If another connection was made to this node, control of the current by the field effect transistor structure would be effected due to the additional connection. It is possible that a connection to this node could be made, for example, by providing a resistor feedback from the drain to the gate of the field effect transistor structure. Connections such as these may still allow operation of the device; however, a connection to this node is not preferred.

Therefore, it is preferred that only the gate-to-source voltage $V_{GS}$ is actively adjusted by connection of a voltage between the gate and source of the field effect transistor structure. The drain-to-source voltage $V_{DS}$ thus will be indirectly varied through operation of the device. This depends on many factors including the size of the features of the device, the gate-to-source voltage $V_{GS}$ and the charge on one or both of the collector anode and the extractor gate. Thus, the field emitter device of the present invention can be made to operate in either of the saturated current region or the active region of FIG. 3 based upon the combination of these factors. Adjustment of the voltages and circuits for operation will now be discussed with reference to the figures of the following embodiments.

FIG. 5 illustrates the field emitter device of the present invention packaged in a dual inline package chip 50. The voltage controlled current source and the field emitter are integrally fabricated on a substrate 60. Bonding wires 72 and 73 connect to the gate and source of a field effect transistor structure of the voltage controlled current source. Bonding wires 74 and 75 connect to an extractor gate and a collector anode of the field emitter device of the present invention. These bonding wires connect to pins 80' on the dual inline package chip 50. Packages other than the dual inline package chip 50 illustrated in FIG. 5 are also possible. Surface mount and hybrid-type packages can also be implemented. Furthermore, the package can have a port provided by a window or slot in the top or side thereof, for example, for emission of electrons from the field emitter to an external collector anode. Therefore, it is not necessary that the collector anode or the extractor gate are formed in the package 50 of FIG. 5.

FIGS. 6–13 illustrate the field emitter device of the present invention having different connections to the source and gate and various combinations of collector anodes and extractor gates. In the embodiments of FIGS. 6–9, two terminals are illustrated for control of the gate-to-source voltage $V_{GS}$. In the embodiments of FIGS. 10–13, the gate and source are shorted yielding a zero volt gate-to-source voltage $V_{GS}$. However, the device is electrically connected by a single terminal needed to provide a source of electrons for emission from the field emitter.

Figure 6:
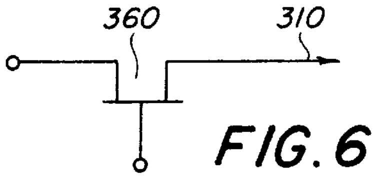
FIGS. 6–13 illustrates schematic block diagrams of the field emitter device of the present invention having different connections to the source and gate and various combinations of collector anodes and extractor gates.
Figure 10:
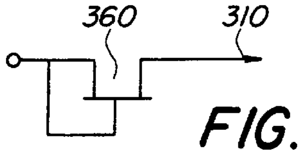

A field emitter device of the present invention is illustrated in FIGS. 6 and 10 having a voltage controlled current source 360 and an electron field emitter 310 but without a collector anode and an extractor gate. A positive charge must exist on an anode somewhere for reception of electrons emitted from the electron field emitter 310; however, the anode does not necessarily need to be part of the field emitter device. For example, only the voltage controlled current source 360 and the electron field emitter 310 can be encapsulated in a package such as that illustrated in FIG. 5. A port can be provided by a window or slot in the top or side of the package, for example, for emission of the electrons from the field emitter to an external collector anode.

Figure 7:
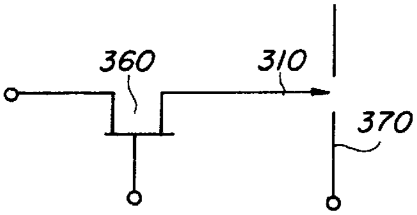
Figure 11:
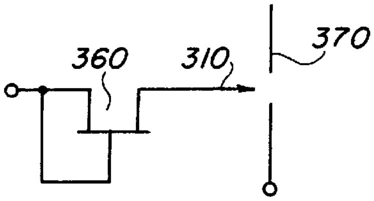
Figure 8:
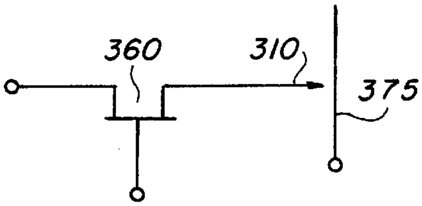
Figure 12:
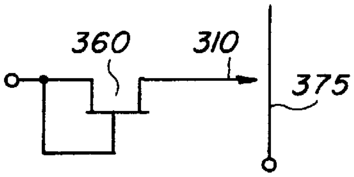
Figure 9:
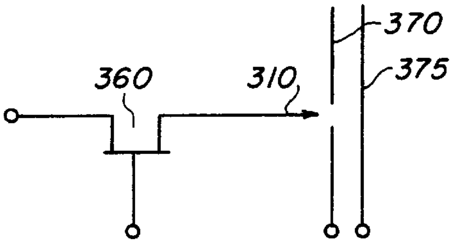
Figure 13:
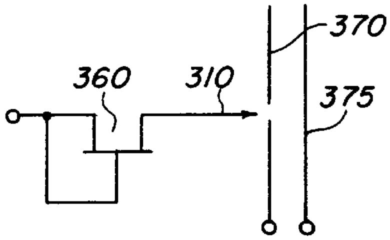
Figure 14:
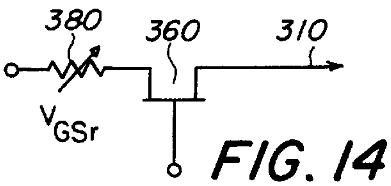
FIGS. 14–17 illustrate schematic block diagrams of the field emitter device of the present invention with a variable device such as a variable resistor or additional field effect transistors.
Figure 16:
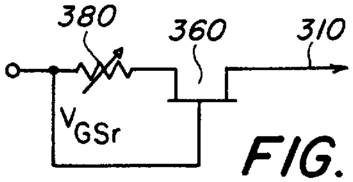
Figure 15:
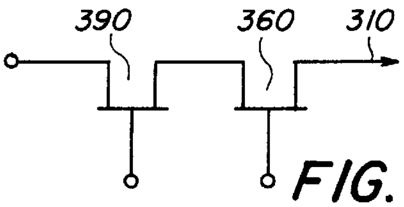
Figure 17:
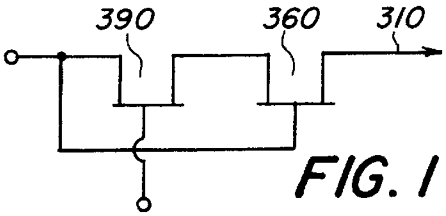

FIGS. 7 and 11 illustrate a field emitter device of the present invention having an extractor gate 370. The extractor gate 370 controls or enhances the flow of electrons out of the electron field emitter 310. The devices of FIGS. 7 and 11 can be encapsulated to form a package with a port for the electron emission as discussed above. FIGS. 8 and 12 illustrate a field emitter device according to the present invention which has a collector anode 375 for reception of the electrons emitted from the electron field emitter 310. FIGS. 9 and 13 illustrate a field emitter device of the present invention having both an extractor gate 370 and a collector anode 375. In the devices of FIGS. 8, 9, 12 and 13, both the extractor gate 370 and the collector anode 375 (as appropriate) can be encapsulated in a package such as that of FIG. 5.

FIGS. 14–17 illustrate the field emitter device of the present invention with a variable current device such as a variable resistor 380 or a field effect transistor 390 connected to the source of the voltage controlled current source 360. The variable current device such as the variable resistor 380 causes a negative gate-to-source differential voltage $V_{GSr}$ and therefore provides for regulating the current output of the electron field emitter to lower current levels than possible without these additional components, or it permits lower current levels than possible with a zero volt gate-to-source voltage $V_{GS}$ from a straight connection between the gate and the source as illustrated in FIGS. 10–13.

FIG. 18 illustrates the field emitter device of the present invention having a multiplexer MUX 495 for connection of a voltage controlled current source 360 to a plurality of electron field emitters 310'. The multiplexer MUX 495 selects one of a plurality of the electron field emitters 310' for connection to the drain of, for example, a field effect transistor 360. A screen 365 is lined with a luminescent material 367 and disposed to form a collector anode and collect electrons emitted from the plurality of electron field emitters 310'. Depending upon which electron field emitter is selected by the multiplexer MUX 495, a particular electron field emitter will illuminate a particular portion of the screen 365. An extractor gate 372 can be disposed between the plurality of electron field emitters 310' and the screen 365 for controlling electron emission from the field emitters.

The voltage controlled current source can also be built from more than one transistor connected in parallel. Thus, multiple currents can individually be controlled, one current by each of the transistors. Multiple currents can be used, for example, to control multiple types of emissions to the luminescent material 367—such as different colors selectable by different currents or different brightnesss for a single color.

FIGS. 19–21 illustrate additional embodiments of the present invention. FIG. 19 illustrates a switch 505, disposed between a voltage controlled current source 560 and an electron emitter 510. The switch 505, like the multiplexer MUX 495, selectively allows the voltage controlled current source 560 to provide electrons for emission from a field emitter 510. The switch 505 can be an external switch which is electrically connected to a substrate monolithically forming the voltage controlled current source 560 and the field emitter 510 therein. The switch 505 can also be monolithically formed in the same integrated circuit as the voltage controlled current source 560 and the field emitter 510. The switch 505, can even be another component formed in the integrated circuit such as a transistor switch.

FIG. 20 illustrates a field emitter device according to another embodiment of the present invention having a voltage controlled current source formed from a vacuum tube 660. The vacuum tube 660 is preferably a tetrode device, albeit that a triode device is shown in FIG. 20. Furthermore, particularly in the embodiment of FIG. 20, an external wire 606 connecting the voltage controlled current source 660 to the electron field emitter 610 is desired. The external wire 606 should have as small a capacitance as possible, preferably a capacitance smaller or comparable to that of the associated vacuum tube or field emitter device. Additionally, voltage controlled current sources formed from other devices such as a field effect transistor or a bipolar junction transistor may use an external wire 606 for connection to the electron field emitter 610. For example, FIG. 21 illustrates a bipolar junction transistor 760 connected by an external wire 606 to an electron field emitter 610. However, the bipolar junction transistor 760 could also be monolithically formed in the same integrated circuit as the electron field emitter 610 without the necessity for an external wire 606.

A plurality of electron field emitters can be connected to the output of a voltage controlled current source. This would allow a high current output of the voltage controlled current source to be divided up among a plurality of electron field emitters.

FIG. 22 illustrates the field emitter device of the present invention connected in a circuit. Three voltage sources $V_1$, $V_2$ and $V_3$ are connected at one end to the source, for example, of a field effect transistor forming the voltage controlled current source 860. Another end of the voltage source $V_1$ is connected to the gate of the voltage controlled current source 860. The voltage source $V_2$ is connected from another end to an extractor gate 870 and the voltage source $V_3$ is connected from another end to a collector anode 875. Thus, the voltages $V_2$ and $V_3$ control the number of electrons emitted from a field emitter 810 onto the collector anode 875. However, the amount of electrons emittable from the field emitter 810 is limited by the voltage controlled current source 860 in dependence upon the amount of voltage $V_1$. The extractor gate 870 can be used to control the number of electrons emitted from the field emitter 810. However, the extractor gate 870 does not ordinarily collect electrons. The electrons preferably pass through an opening in the extractor gate 870 for collection by the collector anode 875. It is possible that the extractor gate 870 and the voltage $V_2$ can be omitted. Furthermore, the collector anode 875 does not necessarily need to be part of the device of the present invention. The collector anode 875 can be any surface desired for reception of electrons emitted from the field emitter 810. This surface, however, must be positively charged with respect to the field emitter to ensure collection of the emitted electrons.

FIG. 23 illustrates the field emitter device of the present invention connected in a feedback arrangement. In FIG. 23, the emitted current from an electron emitter 910 is used to adjust the potential on the gate of a field effect transistor 960. When current is emitted from the field emitter 910, the emitted current is fed back to the gate of the field effect transistor 960 thereby decreasing the channel conductance therein. Thus, runaway current emitted from the field emitter 910 can be prevented. A voltage source V should be connected between the field effect transistor 960 and a collector anode 975. It is preferred that this voltage source V is connected directly to the gate of the field effect transistor 960 and a resistor 955 is connected across the gate and the source of the field effect transistor 960.

Figure 24:
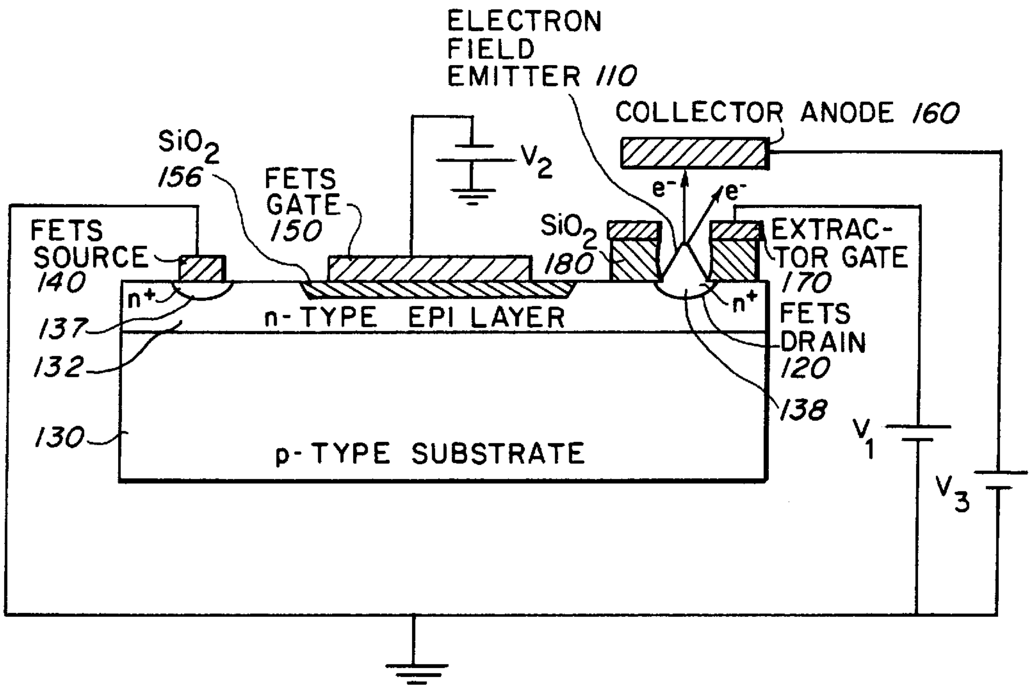
FIGS. 24–26 illustrate various structures for a field effect transistor of the field emitter device of the present invention.
Figure 25:
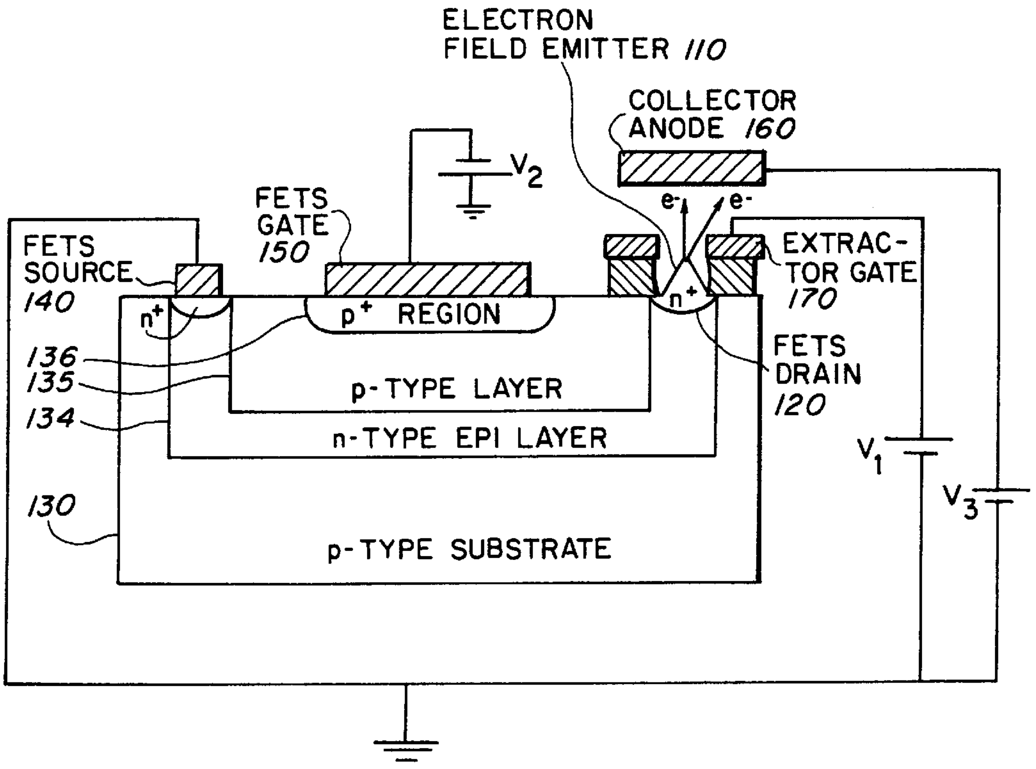
Figure 26:
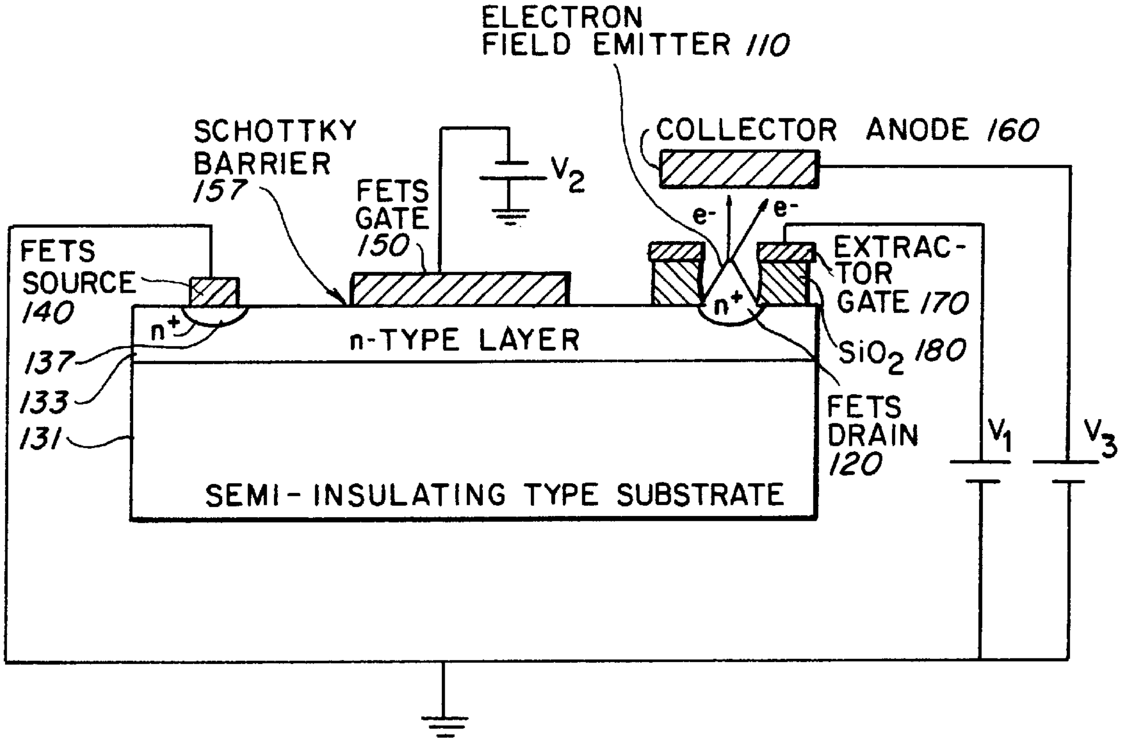

FIGS. 24–26 illustrate various structures for a field effect transistor of the field emitter device of the present invention. The field effect transistor structure can be made of all various known types of field effect transistors. The field effect transistor can be a silicon JFET or a gallium arsenide JFET. The silicon JFET can be a single-channel, V-groove or multichannel JFET and the gallium arsenide JFET can be a diffused, grown or heterojunction JFET. The field effect transistor can also be a silicon MESFET, InP MESFET or a heterostructure MESFET. Furthermore, the field effect transistor can be a gallium arsenide MESFET of the single or dual-gate type or of an interdigital structure. Additionally, the field effect transistor can be a gallium arsenide MOSFET or a silicon MOSFET of the NMOS, PMOS, CMOS, HMOS, DMOS, DIMOS, VMOS, SOS or SOI types. Additional FET structures can also be implemented.

FIG. 24 illustrates an embodiment of the present invention using a MOSFET. A field emitter 110 is integrally fabricated on a p-type substrate 130 of the MOSFET. An n-type epitaxial layer 132 is grown on the p-type substrate 130. For ohmic contact to the source and drain of the field effect transistor, n+ regions 137 and 138 are provided in the n-type epitaxial layer 132. A gate insulation layer 156, such as silicon dioxide $SiO_2$, is formed over an n-channel of the n-type epitaxial layer 132. A gate 150 is provided thereon by a metalization layer to provide a conducting gate electrode. An electron field emitter 110 is formed on or in the n+ drain region. An insulation layer 180, such as silicon dioxide $SiO_2$, is formed around the electron field emitter 110, and an extractor gate 170 is formed on the insulation layer 180.

A positive voltage $V_1$ is provided between the FETS source 140 and the extractor gate 170. A positive voltage $V_3$ is also applied between the FETS source 140 and the collector anode 160. As electrons leave the electron field emitter 110, a positive potential with respect to the FETS source 140 is formed on the FETS drain 120. This potential difference between the source 140 and the drain 120 in the field effect transistor structure is the drain-to-source voltage $V_{DS}$. By applying a negative voltage $V_2$ on the FETS gate 150 with respect to the source 140, a depletion region is formed in an n-channel of the n-type epitaxial layer 132 under the FETS gate 150. This depletion region controls the current through the channel of the field effect transistor structure. That is, the resistance of the n-channel is changed by the voltage applied to the FETS gate 150. The potential on the FETS drain 120 and hence the field emitter 110 is determined by the IR (e.g. current×resistance) drop across the FETS n-channel and the voltage $V_2$ applied to the FET gate 150. As the potential on the FETS drain 120 increases, i.e., increases towards the potential of the extractor gate 170, the electric field at the tip of the electron field emitter 110 decreases with a resultant decrease in emission of electrons $e^-$ from the field emitter.

FIG. 25 illustrates another embodiment of the present invention using a junction FET (JFET). For example, a p-type substrate 130 is used with a n-type epitaxial layer 134 having a thickness chosen for the particularly desired channel transport properties. A p-type layer 135 is formed, for example, by diffusion or ion implantation over n-type epitaxial layer 134. Alternatively, an additional epitaxial process with associated diffusion or implantation therein could also be employed. Finally, a p+ region 136 and a FETS gate 150 metalization is formed as illustrated in FIG. 25. Voltage sources $V_1$, $V_2$ and $V_3$ similarly control the operation of this field emitter device of the present invention, as discussed above with reference to FIG. 24.

FIG. 26 illustrates a further embodiment of the present invention using a MESFET made from a semi-insulating semiconductor material such as gallium arsenide. A semi-insulating type-substrate 131, preferably gallium arsenide GaAs, is provided. An n-type layer 133 and a FET gate 150 is formed thereon to provide a Schottky barrier 157 therebetween. An n+ source region 137 is formed in the n-type layer 133 for an ohmic contact to the source metalization 140. However, it is not necessary to form an n+region for the drain 120. The drain 120 can be accommodated merely by provision of the electron field emitter 110 at the appropriate drain location. However, an n+ region at the drain could also be provided in other embodiments such as in the MESFET embodiment of FIG. 26. Likewise, the n+ region at the drain could be omitted in other embodiments such as in the MOSFET embodiment of FIG. 24.

The electron field emitter 110 can be formed from any conducting material, such as, metals, elementary semiconductors, compound semiconductors, semiconductor heterostructures, semi-metals, superconductors, conducting organics, compounds and composites. Furthermore, the field emitter can consist of one field emitter for each FETS drain or include a plurality of field emitters integrally gated or formed in the integrated circuit or connected thereto to provide a field emitter array (FEA). Additionally, the field effect transistor structure can be formed with multiple gates for multiple depletion regions and gate metalizations between a pair of a source and drain.

The voltage controlled current source in the field emitter device of the present invention preferably is made of a field effect transistor structure. The field effect transistor chosen for use shall provide the following characteristics. The current capability of the field effect transistor should be matched to the current capability of the field emitter device. A single emitter, for example, has a current capability of about 1–10 microamps ($\mu$A). Therefore, connection to a single field emitter, a field effect transistor with a 1–10 microamp ($\mu$A) current capability is preferred. For driving 200 to 1,000 field emitters in a field emitter array making up, for example, a high speed refreshed display, a single field effect transistor driving such field emitter array should have a current capability of about 1 milliamp (mA). The field effect transistor may need a current capability of up to about 100 milliamps (mA) for driving a small travelling wave tube. Furthermore, a field emitter array can be used for construction of a smart power rectifier which utilizes many field emitters in parallel for switching high currents. In such an instance, a field effect transistor capable of high current is required. Because field emitters can each have a current of about 10 microamps ($\mu$A) for a silicon field emitter and up to 0.5 milliamps (mA) for a metal field emitter, the current capability of the field effect transistors may vary not only dependent upon the number of field emitters but the type of field emitter.

Second, the voltage breakdown of the field effect transistor must also exceed the maximum operating variation voltage at the tip of the field emitter. Specifically, the voltage breakdown between the source and drain and/or the drain and gate of the field effect transistor must exceed a voltage operation difference $\Delta V$ between the voltage $V_a$ and $V_b$ illustrated in the Fowler-Nordheim equation of FIG. 4. Voltages $V_a$ and $V_b$ in FIG. 4 represent the upper and lower extremes of the voltage during operation of the field emitter device. Thus, the breakdown of the field effect transistor should be above the voltage difference $\Delta V$ between the upper and lower voltages $V_a$ and $V_b$ as defined by FIG. 4. For example, assuming a field effect transistor having a source and drain breakdown voltage of about 10 volts, a breakdown strength of $10^5$ V/cm, the total fluctuation of the voltage difference $\Delta V$ should not exceed 10 volts.

Figure 27A:
FIGS. 27(*a*) through 27(*c*) illustrate block diagrams of an end view of a substrate during processing by micromachining to produce the field emitter device of the present invention.
Figure 27B:
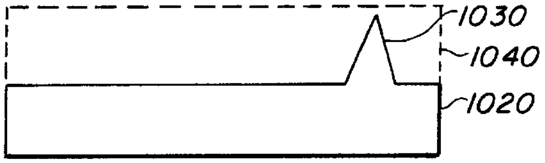
Figure 27C:
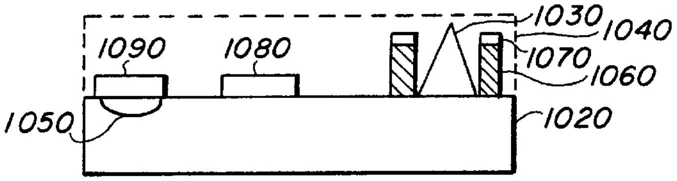

FIGS. 27(*a*) through 30(*d*) illustrate end views of a substrate during various steps for producing various embodiments of the field emitter device of the present invention.

FIGS. 27(*a*) through 27(*c*) illustrate a process for producing the field emitter device of the present invention by micromachining a single crystal semiconductor substrate. FIG. 27(*a*) illustrates a single crystalline semiconductor substrate 1010. The single crystal semiconductor substrate 1010 is micromachined by etching, for example, to provide the substrate 1020 illustrated in FIG. 27(*b*). The substrate 1020 in FIG. 27(*b*) has a field emitter 1030 protruding into the etched away portion 1040 of the original single crystalline semiconductor substrate 1010. A doped region 1050 is formed in the substrate 1020 by diffusion or ion implantation to form a source, as illustrated in FIG. 27(*c*). A doped region is not necessary at the drain of the field effect transistor; however, a doped region can be formed under the electron field emitter 1030 by diffusion or ion implantation. Furthermore, these doped regions can be formed before the micromachining. Additionally, when a doped region is formed underneath the electron field emitter 1030, preferably the electron field emitter 1030 is also doped with the same ions as the doped region. An insulator layer 1060 such as silicon dioxide $SiO_2$ is formed around the field emitter 1030, as illustrated in FIG. 27(*c*). Then, metalization layers 1070, 1080 and 1090 are formed. Metalization layer 1080 provides a gate and metalization layer 1090 provides a source at the contact of the doped region 1050 for the field effect transistor of the device of the present invention. Metalization layer 1070 is formed on the insulators 1060 to provide an extractor gate for the field emitter 1030. The tip of the field emitter 1030 can extend above the metalization layer 1070. Alternatively, the tip of the field emitter 1030 can extend to the same height as the extraction gate 1070 or extend below the height of the extraction gate 1070. Depending upon the height of the tip of the field emitter 1030 with respect to the extraction gate metalization 1070, the characteristics of operation of the device can be varied.

Further details concerning the micromachining of a crystalline semiconductor substrate to form the device of the present invention are available from the following publications, which are incorporated herein by reference: U.S. Pat. No. 4,578,614 issued to Gray et al.; "A Vacuum Field Effect Transistor Using Silicon Field Emitter Arrays". Additional information on micromachining of a crystalline semiconductor substrate to form the device of the present invention may be found in the following publications: H. F. Gray et al., *IEDM Technical Digest,* The International Electron Devices Meeting, Los Angeles, Calif., Dec. 7–10, 1986, pp. 776–779; "High Current Density Silicon FEAs", H. F. Gray et al., *Technical Digest of IVMC,* Fourth International Vacuum Micro Electronics Conference, Aug. 22–24, 1991, pp. 30 and 31; and "Point and Wedge Tungsten-On-Silicon Field Emitter Arrays", H. F. Gray et al., *IEDM Technical Digest,* Washington, D.C., Dec. 9, 1991.

Figure 28A:
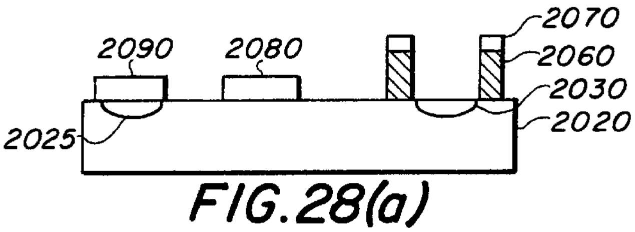
FIGS. 28(*a*), 28(*bi*), 28(*bii*) and 28(*c*) illustrate end views of substrates during processing by electron beam deposition (FIG. 28(*bi*)) and material deposition (e.g. thermal deposition) (FIG. 28(*bii*)) to form the field emitter of the field emitter device of the present invention (FIG. 28*c*)
Figure 28:
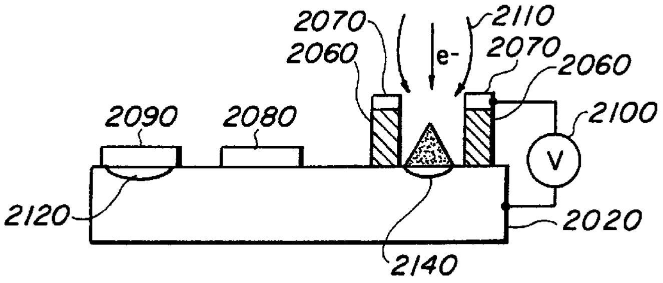
Figure 28C:
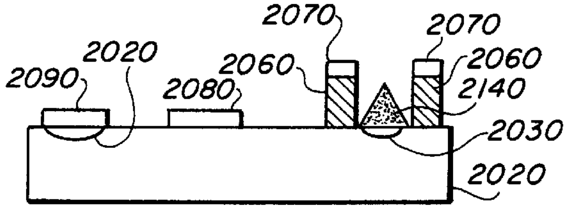
Figure 29A:
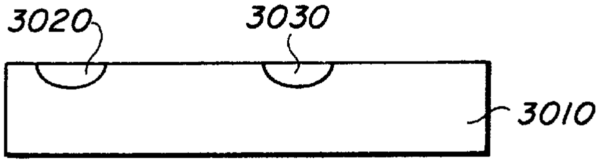
FIGS. 29(*a*) through 29(*g*) illustrate end views of a substrate during a process for forming a thin-film edge emitter electron field emitter structure, an integral part of a field effect transistor structure of the field emitter device of the present invention.
Figure 29B:
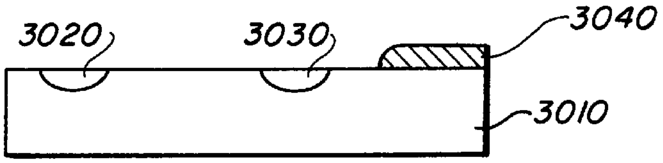
Figure 29C:
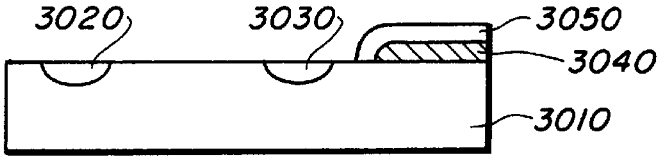
Figure 29D:
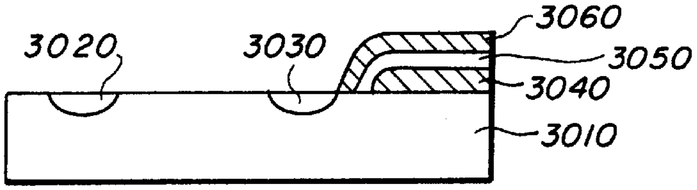
Figure 29E:
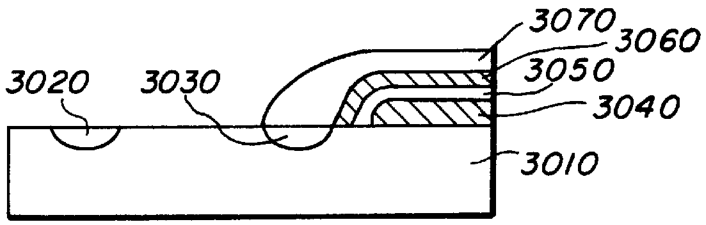
Figure 29F:
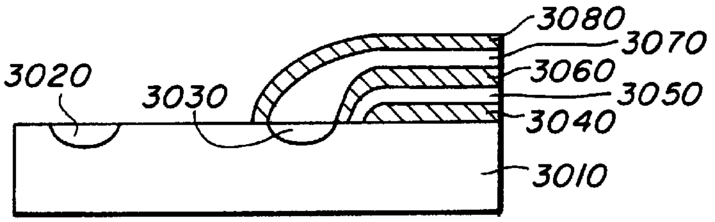
Figure 29G:
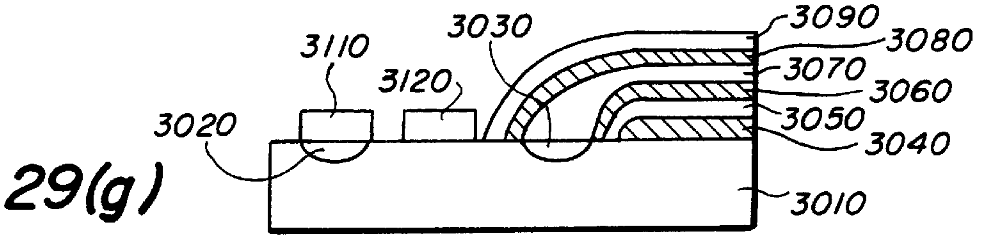
Figure 30A:
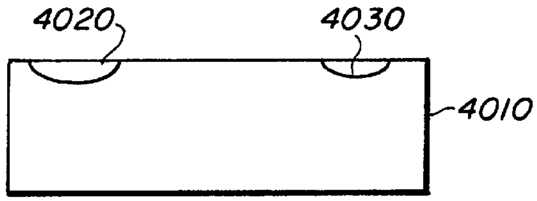
FIGS. 30(*a*) through 30(*d*) illustrate end views of a substrate processed by gluing a prefabricated field emitter cone onto the drain region of a field effect transistor of the field emitter device of the present invention.
Figure 30B:
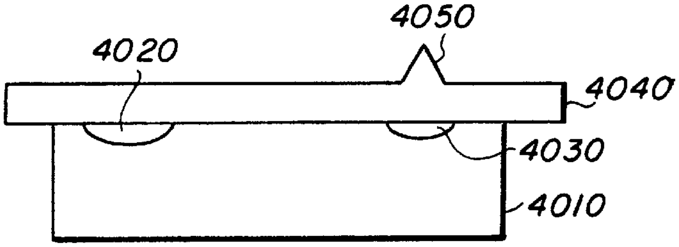
Figure 30C:
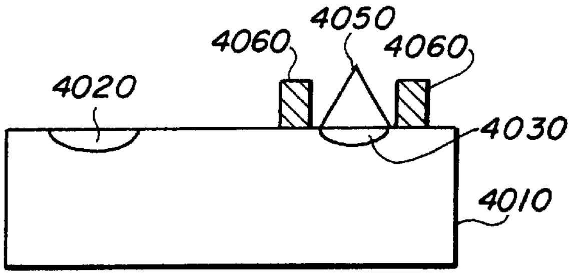
Figure 30D:
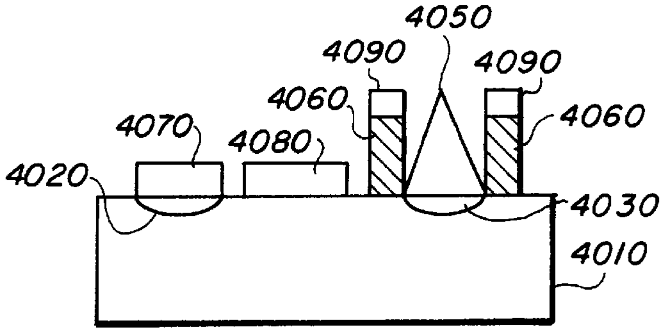

FIGS. 28(*a*), 28(*bi*), 28(*bii*) and 28(*c*) illustrate end views of substrates during processing by electron beam decomposition and material deposition to form the field emitter of the field emitter device of the present invention. FIG. 28(*a*) illustrates a substrate 2020 in which a doped region 2025 is formed by an implantation or diffusion to provide an ohmic contact at the source of the field effect transistor. Furthermore, a doped region 2030 can also be formed, if desired. Thereafter, an insulator layer 2060 is formed around a region to become the drain of the field effect transistor as illustrated in FIG. 28(*a*). Metalization layers 2070, 2080 and 2090 are then formed thereon as illustrated in FIG. 28(*a*). It is possible, however, that the metalization layers, particularly layers 2080 and 2090, are formed at a later time.

FIG. 28(*bi*) illustrates a step for forming a field emitter cone by electron beam deposition using a dynamic electrostatic lens. The dynamic electrostatic lens is formed by a voltage source 2100 connected between the substrate 2020 and the metalization 2070 of the extractor gate. An electric field between the substrate 2020 and the metalization 2070 dynamically forms the electron beam, e, 2110. As the electron beam, e, 2110 approaches the substrate in a direction perpendicular to the horizontal surface of the substrate, the electric field formed by the voltage source 2100 between the metalization layer 2070 and the substrate 2020 causes the electron beam, e, 2110 to bend inward towards a focussed location. Because the wafer is immersed in a metal bearing gas, the electron beam, e, 2110 will cause deposition of the metal from the metal bearing gas onto the drain region. As a pile of metal deposition 2140 builds on the surface of the substrate 2020, a smaller voltage gap is produced between the top of the pile of the metal deposition 2140 and the metalization 2070 of the extractor gate. Due to the smaller voltage gap, the electric field between the metalization 2070 of the extractor gate and the top of the metal deposition 2140 increases. Because a smaller voltage gap produces a higher electric field, the electron beam, e, 2110 is dynamically focussed more narrowly causing the deposited metal to build up to a point and form the tip of the field emitter. Thus, with a constant voltage on the voltage source 2100, during electron beam deposition, a cone-shaped field emitter having a sharp tip will be produced. Should a steeper or shallower slope to the cone be desired, the voltage on the voltage source 2100 can be varied as the metal deposition builds up to dynamically control the slope of the cone.

FIG. 28(*bii*) discloses a physical vapor deposition step. The physical vapor deposition step illustrated in FIG. 28(*bii*) is an alternative to the electrostatic lenses of the step illustrated in FIG. 28(*bi*). In FIG. 28(*bii*), the evaporated metal is directed upon the substrate 2020. Metal deposits form on the surface of the wafer as illustrated including the region on top of the metalization 2070. As the metal deposits 2120, 2130 and 2140 form, balls of metalization 2130 will begin to form atop the metalizations 2070 of the emitter gate. As the balls of metalization 2130 grow, the opening will narrow—causing the metalization 2140 there beneath to grow up and to a point, thus forming a cone. Eventually, the balls of metalization 2130 will grow so large that the opening is closed off and a perfect tip on a cone-shaped field emitter formed of the metalization 2140 will have been produced. A cone-shaped field emitter is produced because the metalization layer 2070 and the insulator layer 2060 are both, for example, ring-shaped formed around the drain region of a field effect transistor. After the physical vapor evaporation and deposition are completed, the excess metalization layers 2120 and 2130 are removed by etching. The etching creeps underneath the balls of metalization 2130 for complete removal of layers 2130 and 2120 by the removal of a selvage layer in a lift off process.

FIG. 28(*c*) illustrates the final product after the lift off process step in the embodiment of FIG. 28(*bii*) or after the electron beam deposition using the dynamic electrostatic lenses of the embodiment of FIG. 28(*bi*). Further details of these electron beam deposition processes are disclosed in U.S. Pat. No. 3,665,241, issued to Spindt et al., which is incorporated herein by reference. Also information on electron beam deposition may be found in the publication by Shaw et al.; "Aperture-Focused e-beam FEA Fabrication Process", *International Vacuum Microelectronics Conference,* Austria, July 1992.

FIGS. 29(*a*) through 29(*g*) illustrate end views of a substrate during a process for forming a horizontal electron field emitter structure from the edge of a thin film which lies on the drain of a field effect transistor. A doped region 3020 and an optional doped region 3030 can be formed in a substrate 3010 as illustrated in FIG. 29(*a*). Then, an insulator layer 3040 is formed on the substrate 3010 as illustrated in FIG. 29(*b*). A metalization layer 3050 forming one side of an extractor gate is then formed as illustrated in FIG. 29(*c*). Thereafter, another insulator layer 3060 is formed on the metalization layer 3050 as illustrated in FIG. 29(*d*). Then, as illustrated in FIG. 29(*e*), another metalization layer 3070 is formed on the insulator layer 3060. The metalization layer 3070 forms the field emitter of the present invention. The metalization layer 3070 should have a thickness much smaller than the thickness of the metalization layer 3050. For example, the thickness of the metalization layer 3070 which forms the field emitter should have a thickness of about 5 to about 20 nanometers (nm) and the metalization layer 3050 forming the extractor gate should have a thickness of about 200 to about 500 nanometers (nm). As illustrated in FIG. 29(*f*) another layer of insulator 3080 is informed on the metalization layer 3070. Thereafter, as illustrated in FIG. 29(*g*), metalization layers 3090, 3110 and 3120 are formed. The metalization layer 3090 is formed on the insulator layer 3080 and forms another side of the extractor gate. The metalization layer 3110 is formed above the doped region 3020 to form the source of the field effect transistor. The metalization layer 3120 is formed between the field emitter and the source to provide the gate for the field effect transistor. Further details of this process are described in the following article, "Film Edge Emitters: The Basis For A New Vacuum Transistor", H. F. Gray et al., *IEDM Technical Digest,* 1991, pp. 201–203.

FIGS. 30(*a*), 30(*b*), 30(*c*) and 30(*d*) illustrate end views of a substrate processed by gluing a prefabricated field emitter cone onto the drain region of a field effect transistor. FIG. 30(*a*) illustrates a doped region 4020 and an optional doped region 4030 formed by diffusion or ion implantation of impurity ions into a substrate 4010. A prefabricated substrate 4040 is then placed atop the substrate 4010 as illustrated in FIG. 30(*b*). The prefabricated substrate 4040 contains a field emitter cone 4050 prefabricated therein. The prefabricated substrate 4040 is attached to the first substrate 4010 by, for example, electrostatic bonding, preform bonding or a conductive epoxy glue. Thereafter, parts of the second substrate 4040 are etched away leaving the field emitter cone 4050 in place above the optional drain doped region 4030. The second substrate having the field emitter cone 4050 prefabricated therein is specifically described by Gray et al. in U.S. Pat. No. 4,307,507 which is incorporated herein by reference. Then as illustrated in FIG. 30(*c*), an insulator laycone 4060 is formed around the field emitter cone 4050. Alternatively, the second wafer 4040 illustrated in FIG. 30(*b*) can contain an insulator layer 4060 therein which is glued to the substrate 4010. Thereafter, after etching, both the insulator layer 4060 and the field emitter cone 4050 would remain. Finally, metalization layers 4070, 4080 and 4090 are formed as illustrated in FIG. 30(*d*). The metalization layer 4070 is formed above the doped region 4020 which provides an ohmic contact for a source connection to a field effect transistor. The metalization layer 4080 is provided between the field emitter cone 4050 and the metalization 4070 to provide a gate for the field effect transistor. The metalization layer 4090 is formed on the insulation layers 4060 to provide an extractor gate for the field emitter device of the present invention.

While the invention has been illustrated and described in detail in the drawings and foregoing description, it will be recognized that any changes and modifications will occur to those skilled in the art. It is therefore intended, by the appended claims, to cover such changes and modifications as fall within the true spirit and scope of the invention.

What is claimed is:

1. A method of producing a field emitter device, comprising the steps of:

(a) forming a field effect transistor structure having a drain which that is without an external electrical contact; and (b) monolithically forming an electron field emitter structure on the drain of the field effect transistor.

2. A method according to claim 1, wherein step (b) comprises the substep of (b1) micromachining a single crystalline semiconductor substrate to form the electron field emitter structure in the same crystalline semiconductor substrate as the field effect transistor.

3. A method according to claim 1, wherein said step (b) comprises the substeps of (b1) forming a layer of metal on a layer of an insulator with a hole therein, the hole corresponding to a location of the drain of the field effect transistor; and (b2) depositing a material into the hole to form the electron field emitter structure within the hole.

4. A method according to claim 1, wherein said step (b) comprises the substep of (b1) fabricating the drain of the field effect transistor such that the intermediate layer of the electron field emitter structure is in contact with said drain.

5. A method according to claim 1, wherein said step (b) comprises the substep of (b1) affixing a prefabricated layer of material above a main surface of a substrate so as to form at least one field emitter cathode at the location of the drain of the field effect transistor.

* * * * *